United States Patent [19]
Chen et al.

[11] Patent Number: 5,495,188
[45] Date of Patent: Feb. 27, 1996

[54] PULSED STATIC CMOS CIRCUIT

[75] Inventors: Chih-Liang Chen, Cupertino, Calif.;
Gary S. Ditlow, Garrison, N.Y.

[73] Assignee: International Business Machines Corporation, Armonk, N.Y.

[21] Appl. No.: 421,343

[22] Filed: Apr. 13, 1995

[51] Int. Cl.⁶ .................................................. H03K 19/096
[52] U.S. Cl. ........................... 326/93; 326/95; 326/98
[58] Field of Search .......................... 326/93, 95, 98, 326/28; 327/198, 185, 225, 210–212

[56] References Cited

U.S. PATENT DOCUMENTS

| | | | |
|---|---|---|---|
| 4,568,842 | 2/1986 | Koike | 327/211 |
| 4,700,086 | 10/1987 | Ling | 326/98 |
| 4,710,650 | 12/1987 | Shoji | 326/98 |
| 5,121,003 | 6/1992 | Williams | 326/121 |
| 5,434,520 | 7/1995 | Yetter | 326/93 |
| 5,440,243 | 8/1995 | Lyon | 326/98 |

*Primary Examiner*—Edward P. Westin
*Assistant Examiner*—Andrew Sanders
*Attorney, Agent, or Firm*—Robert P. Tassinari, Jr.

[57] ABSTRACT

A pulsed static CMOS circuit. Improved static CMOS circuit speed is achieved without using a clock scheme like that in dynamic CMOS circuits. The disclosed circuit family is a pulsed static CMOS circuit which makes only a single transition during evaluation. The circuit is reset to a predetermined state by an input pattern, which is in favor of the faster switching direction of the static CMOS.

8 Claims, 4 Drawing Sheets

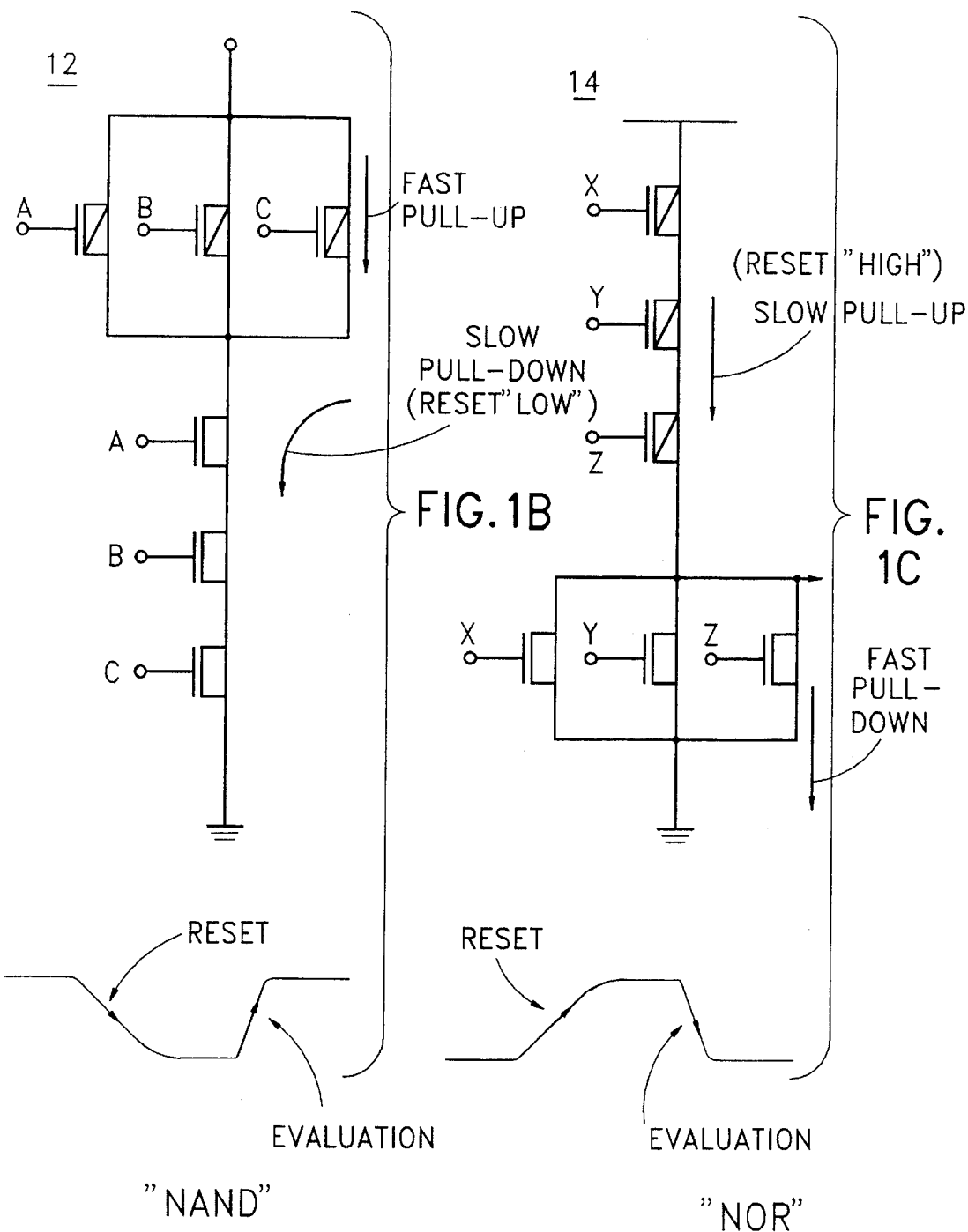

5,495,188

PULSED STATIC CMOS CIRCUIT

FIELD OF THE INVENTION

The invention relates to digital circuits, and in particular to static CMOS circuits.

BACKGROUND OF THE INVENTION

Clocked dynamic CMOS circuits typically have both a pre-charge and an evaluate phase during a cycle. Static CMOS circuits, on the other hand, evaluate and then hold the state until the next cycle. Each of these circuit families has its own advantages and disadvantages. Dynamic circuits are fast, but they are also susceptible to noise. Static circuits are slower than dynamic circuits, but they have greater noise immunity. It would be desirable to combine the benefits of these different circuit families without also incorporating their disadvantages.

Typically, a static CMOS circuit is slower than a dynamic circuit for several reasons:

1) The delay of static CMOS circuits has history dependence based on the input patterns from the previous cycle;
2) Static CMOS circuits can switch multiple times within a cycle. For example, in the case of a two-way NOR, if the first input switches from 1 to 0 and later the second input switches from 0 to 1, then the output will switch from one 0 to 1 to 0. The delay through the NOR is valid only after the second input has switched;
3) Static CMOS has twice the gate capacitance to drive since it drives both p-channel and n-channel devices on the next stage. Dynamic circuits, on the other hand, have half the load of static CMOS since they drive only n-channel devices.

Combining the best aspects of dynamic and static circuits, we have developed a new circuit set which is faster than static circuits and has better noise immunity than dynamic circuits.

SUMMARY OF THE INVENTION

The present invention is an electrical logic circuit, comprising: a first dynamic latch having a data input and a system clock input, the dynamic latch producing a pulsed output characterized by an evaluate edge and a data reset edge; a logic circuit coupled to receive the pulsed output of the first dynamic latch, the logic circuit comprising means for producing a pulsed output signal, one edge of which comprises evaluate information, the logic circuit being characterized in that it has no clock input; a second dynamic latch coupled to receive the pulsed output from the logic circuit.

FIGURES

FIG. 1(b) is a detailed depiction of a NAND circuit, and of the circuit's characteristic curve.

FIG. 1(c) is a detailed depiction of a NOR circuit and of the circuit's characteristic curve.

DETAILED DESCRIPTION

If static CMOS circuits could be pre-conditioned (similar to precharging of dynamic circuits, a well-known technique), then many of the above-mentioned performance problems associated with static circuits would disappear. The way to precondition these circuits is to have two sets of input patterns propagate through the logic. The first pattern causes the circuit to evaluate and create the leading edge of a pulse. The state is held as in static CMOS until a second set of input patterns causes the circuit to reset. This reset wave creates the trailing edge of the pulse and pre-conditions the static circuit to a state so that a fast evaluation is possible on the next cycle.

Figure 1A:
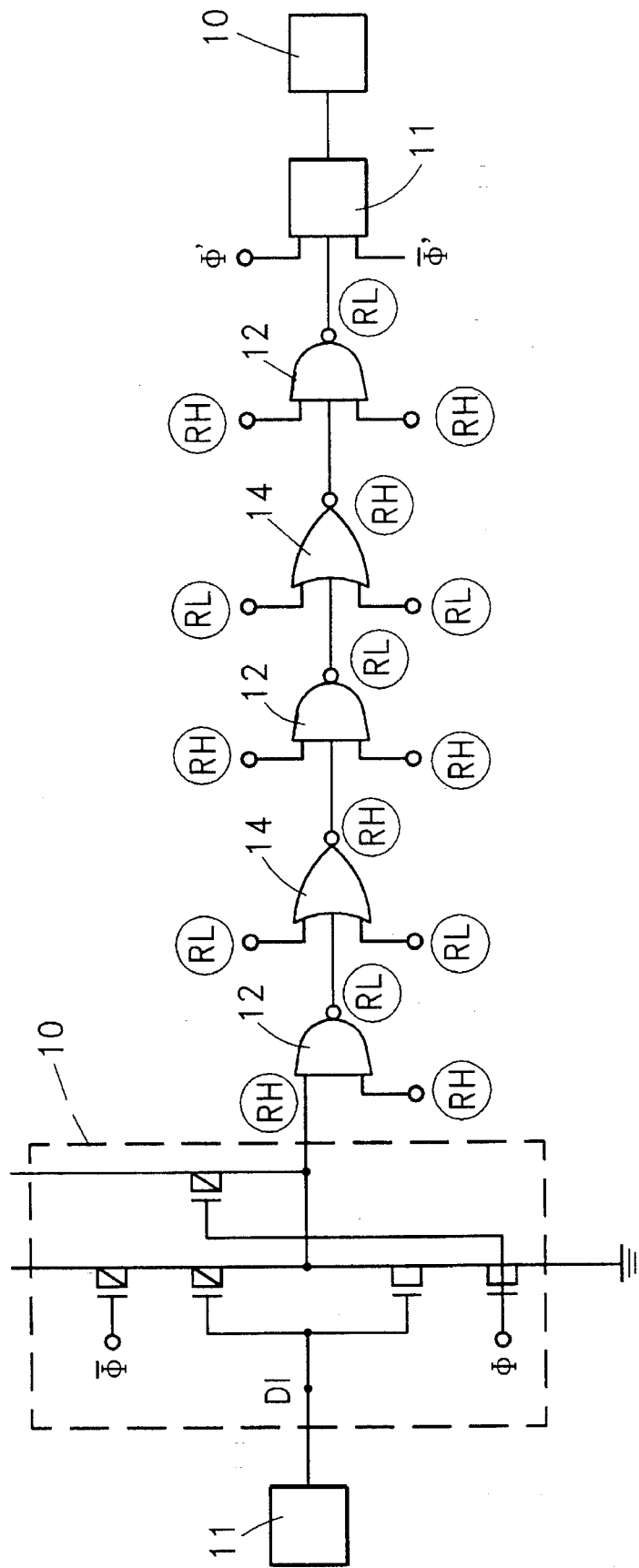
FIG. 1(a) is a schematic diagram of one embodiment of a pulsed static CMOS circuit in accordance with the present invention.

FIG. 1(a) shows a circuit constructed in accordance with the present invention. The circuit comprises a latch 11, which in a preferred embodiment is any suitable static latch, and a pulse generator 10, which in the preferred embodiment shown is a tri-state inverter. When the clock is active (i.e., at logic state 1), the tri-state inverter allows data to propagate (evaluation edge of the pulse); when the clock is inactive (0), the tri-state inverter resets its output to a logic 1 (reset edge of the pulse.) Elements 10 and 11 together constitute a dynamic latch. It will be understood that any other dynamic latch capable of producing a pulsed output (one edge of which is "evaluate", and the other edge of which is "reset") in response to an incoming data signal and a clock will be suitable. The circuit of FIG. 1(a) also includes a plurality of logic gates (NAND gates 12 and NOR gates 14) arranged in multi-stage fashion. It can be seen that the gates are arranged alternatively as having either all reset high (RH) or reset low (RL) inputs. The output of the final logic stage is applied to a second latch 11. Only the evaluate edge of the input will be of use to the latch, the reset edge is disregarded. Detailed views of the NAND and NOR gates are shown in FIGS 1(b) & (c).

As shown in FIG. 1(b), a typical NAND circuit will exhibit a fast pull-up, but a slow pull-down. In such a case, it would be desirable to reset the circuit to a low state. That is, if the circuit of FIG. 1(b) is to change state, we would prefer to have it change only from low to high during an evaluation. This minimizes the evaluate time of the gate (note that if the data input to the gate requires an evaluate to low, no state change will be necessary since the circuit will have been preset low). FIG. 1(c) shows a typical NOR circuit having slow pull-up and fast pull down. It is clear that it would be desirable if this circuit was preset high.

In accordance with the present invention, since a pulse is being propagated in static circuits, this circuit is called pulsed-static CMOS (PS-CMOS). All path lengths to the receiving latches have to be padded so that the arrival times of all paths at the receiving latches occur at about the same time.

Wave pipelining is another way to visualize the circuit behavior. The first wave at the beginning of the cycle is the evaluation phase. A few logic levels behind the evaluate wave is the reset (or precondition wave) which initializes the inputs of the first level of logic to a 0 (or a 1, as the case may be). This forces the outputs to be a logic 1 (or 0) since the p-channel logic tree is active. The n-channel logic trees on the second level are then pulled down (or pulled up) since all inputs are forced to a 1 (or a 0) from the previous level. This alternation between 0 and 1 ripples forward through the logic during the reset phase. For best performance the logic levels are alternated NAND/NOR stages. This is not a requirement, however, since any static CMOS circuit on the first level will reset high (RH) when all inputs are reset low (RL). Similarly, any static CMOS circuit in the next level will reset low since the outputs of the previous level have all been reset high.

RESET TIMING

Figure 2:
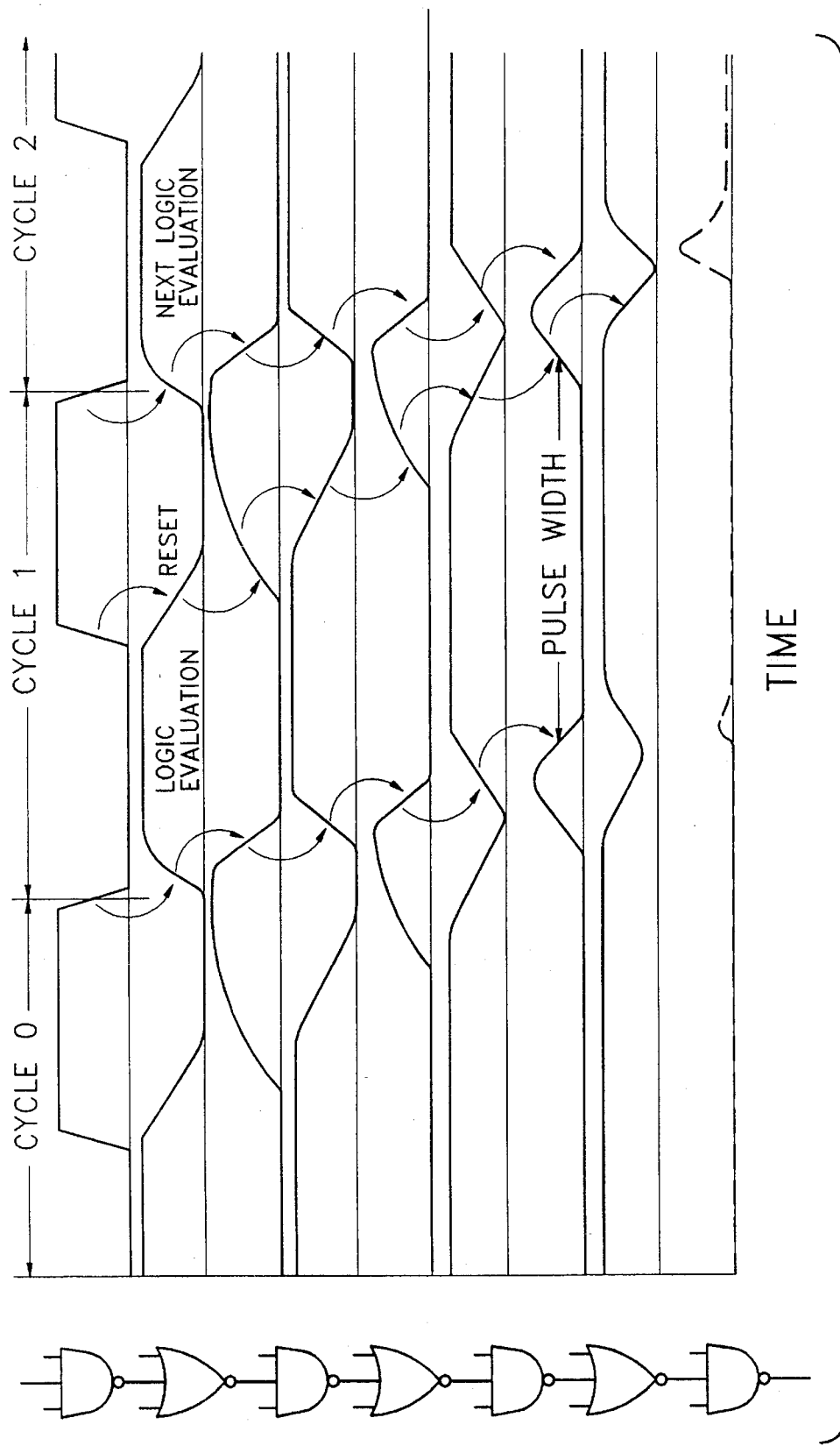
FIG. 2 depicts waveforms at various points in a multistage logic device in a accordance with the invention.

The evaluation wave should be fast, while the reset wave can be slower by about a factor of 1.5 times. Consider, for example, a circuit having 7 levels of logic, as shown in FIG. 2. Assume further that each logic level takes one unit of time to evaluate and resets in 1.5 units of time. FIG. 2 shows the reset and evaluate waves at any instant in time during the cycle. If the evaluate wave catches the reset wave, the circuits at the end of the cycle reduce to static CMOS with the possibility of multiple switching. Ideally the reset should finish with enough margin such that the evaluate wave never catches up.

Figure 3:
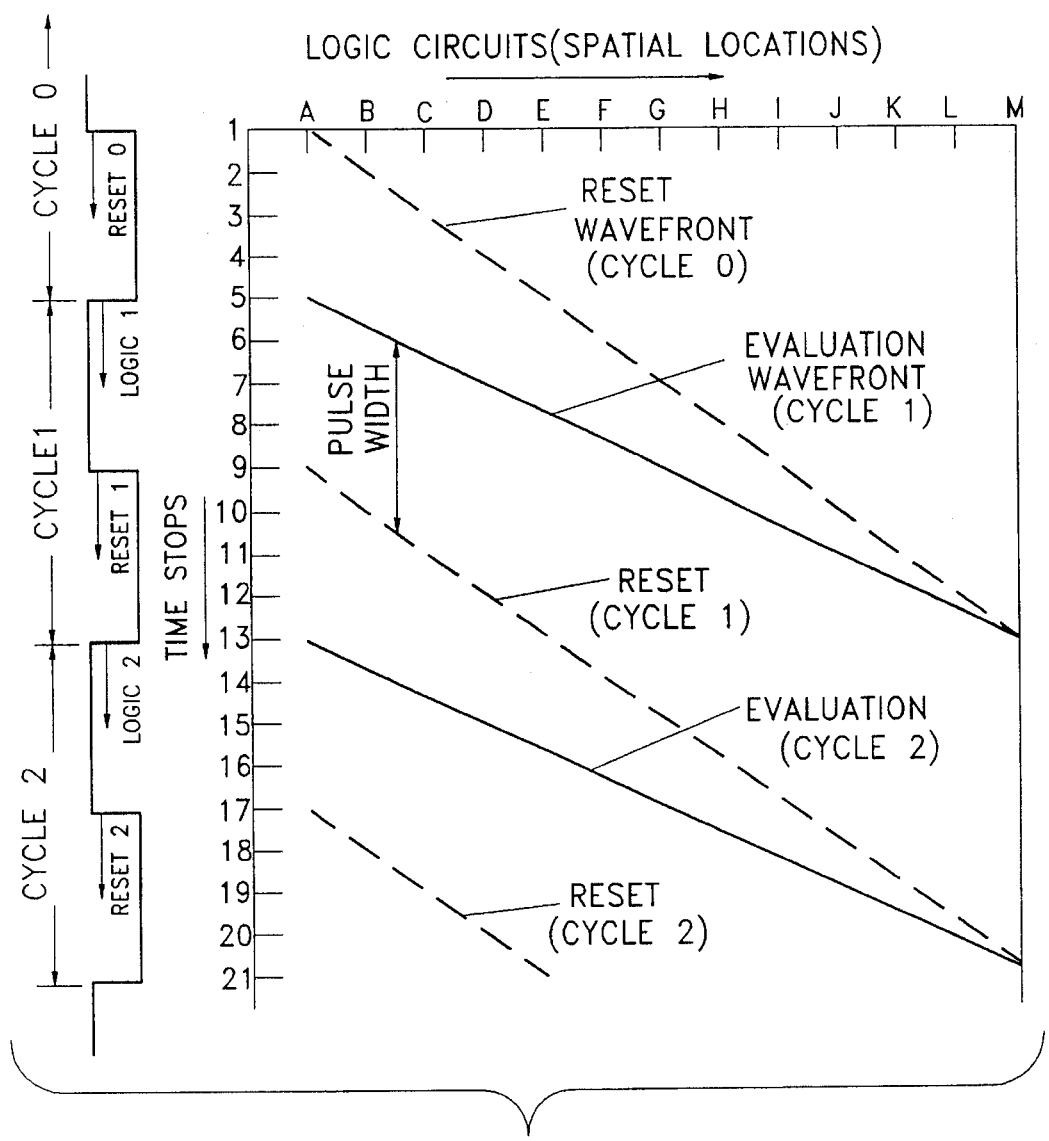
FIG. 3 depicts the spatial locations with respect to time of a signal in a multistage logic circuit in accordance with the invention.

A detailed space-time relationship of the reset and evaluation wavefronts in a 13-stage logic circuit (stages A–M) is shown in FIG. 3. It can be seen that the pulse width actually grows as the wave propagates through the levels of the circuit. For example, the pulse width is four units of time for gate A (time steps 5–9), but the pulse width grows to approximately 7 units at logic gate M (time steps 13–20). This occurs because the reset wave is slower than the evaluate wave. Having long pulses at the last logic level is good for the receiving latch since it sees a long hold time for valid data.

CIRCUIT ADVANTAGES

There are a number of advantages to Pulsed-Static-CMOS:

1) No dynamic nodes exist within the circuit. As a result, the good noise immunity of static circuits is retained.

2) Devices can be sized so that the reset delay for a circuit is slower than the evaluation delay. In the case of a NOR circuit, the inputs are reset to 0 causing the output to be reset to 1. By making the p-channel devices smaller, the rest delay is slower but the gate capacitance that the previous circuit sees is reduced since the p-channel capacitance is reduced. In an AOI (AND-OR-INVERTER) circuit, the inputs can be pre-set either high or low by properly adjusting device sizes.

3) Each latch output can be preset to either logic 0 or 1 by attaching a preset inverter which selects either the "real" data or the data which forces a reset.

4) The delay equations in traditional static CMOS are conservative since there is pattern dependence based on patterns applied on the previous cycle. In PS-CMOS, this history dependence disappears and is known a priori at the start of the evaluation cycle. As a result, the delay equations for PS-CMOS can be more aggressive by taking into account the preconditioning and lack of history dependence on the previous cycle.

5) The reset clock of the PS-CMOS circuit is distributed only to the MUXes on the output of a latch. The reset clock sees a much smaller load than a 2-phase dynamic clock which distributes to each logic circuit. The resetting of nodes ripples through the logic one level at a time and uniformly spreads the di/dt requirements across the entire cycle.

6) If there are delay defects in the circuit, then PS-CMOS will still work when the system cycle is slowed down (although allowable clock speed is bounded by the reset wave).

SUMMARY

Compared to traditional Static CMOS, PS-CMOS is only slightly more complex to design than static CMOS, but is faster because 1) capacitive loading can be reduced by making p-devices smaller of circuits which are preconditioned "high", and making n-devices smaller for circuits which are preconditioned "low"; and/or 2) device widths can be skewed toward the evaluate portion of the circuit.

Resetting nodes also reduces the history dependence from previous cycles and enforces unipolar switching to eliminate parasitic delay.

While the invention has been described particularly with respect to preferred embodiments thereof, it will be understood that modifications to the disclosed embodiments can be effected without departing from the spirit and scope of the invention.

We claim:

1. An electrical logic circuit, comprising:
   a first dynamic latch having a data input and a system clock input, the dynamic latch producing a pulsed output characterized by an evaluate edge and a data reset edge;
   a logic circuit coupled to receive the pulsed output of the first dynamic latch, the logic circuit comprising means for producing a pulsed output signal, one edge of which comprises evaluate information, the logic circuit being characterized in that it has no clock input;
   a second dynamic latch coupled to receive the pulsed output from the logic circuit.

2. The circuit of claim 1, wherein the logic circuit comprises a plurality of stages of logic gates, the gates in a first stage of the plurality of stages being coupled to receive the pulsed output of the first latch, the reset edge of the pulsed output of the first latch having a first reset characteristic, and the first stage of logic circuits comprising means for producing a pulsed output signal having an evaluate edge and a reset edge having a second reset characteristic.

3. The circuit of claim 2, wherein the first reset characteristic is reset-high, and the second reset characteristic is reset-low.

4. The circuit of claim 2, wherein a second stage of the plurality of stages is coupled to receive the pulsed output from the first stage and produce a pulsed output having an evaluate edge and a reset edge, the reset edge having a reset characteristic opposite the reset characteristic of reset edge output from the first stage.

5. The circuit of claim 4, wherein the first stage comprises a static NAND gate.

6. The circuit of claim 4, wherein the second stage comprises a static NOR gate.

7. The circuit of claim 1, wherein the first dynamic latch comprises:
   a static latch having means for receiving the data input and producing a data output signal; and
   a pulse generator coupled to receive the data output signal and including means for producing the pulsed output.

8. The circuit of claim 7, wherein the pulse generator is a tri-state inverter.

* * * * *